United States Patent
Yonekawa et al.

(10) Patent No.: US 8,049,539 B2
(45) Date of Patent: Nov. 1, 2011

(54) CIRCUIT WITH VARIATION CORRECTION FUNCTION

(75) Inventors: Masayuki Yonekawa, Kasugai (JP); Takehito Doi, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 10/401,604

(22) Filed: Mar. 31, 2003

(65) Prior Publication Data

US 2003/0184352 A1    Oct. 2, 2003

(30) Foreign Application Priority Data

Apr. 1, 2002   (JP) ................................. 2002-098892

(51) Int. Cl.
*H03L 7/00* (2006.01)
(52) U.S. Cl. ........................................................ 327/156
(58) Field of Classification Search .................. 327/156, 327/147, 362, 378, 513, 157, 162, 148, 155, 327/158
See application file for complete search history.

(56) References Cited

U.S. PATENT DOCUMENTS

| | | | | |
|---|---|---|---|---|
| 5,412,349 A * | 5/1995 | Young et al. | ..................... | 331/34 |
| 6,081,146 A * | 6/2000 | Shiochi et al. | ................. | 327/277 |
| 6,104,222 A * | 8/2000 | Embree | .......................... | 327/156 |
| 6,297,659 B1 * | 10/2001 | Saito | .............................. | 324/765 |
| 6,414,527 B1 * | 7/2002 | Seno et al. | ..................... | 327/158 |
| 6,456,166 B2 * | 9/2002 | Yabe | ............................... | 331/34 |
| 6,522,208 B1 * | 2/2003 | Knowles | .......................... | 331/34 |
| 6,600,380 B1 * | 7/2003 | Guggenbuhl et al. | ...... | 331/117 R |
| 6,633,186 B1 * | 10/2003 | Bazes | ............................ | 327/159 |
| 2002/0190765 A1 * | 12/2002 | Matsunami et al. | .......... | 327/156 |

FOREIGN PATENT DOCUMENTS

| | | |
|---|---|---|
| JP | 06-037247 A | 2/1994 |
| JP | 08-264718 A | 10/1996 |
| JP | 2002-076280 A | 3/2002 |

* cited by examiner

*Primary Examiner* — Lincoln Donovan
*Assistant Examiner* — Khareem E Almo
(74) *Attorney, Agent, or Firm* — Arent Fox LLP

(57) ABSTRACT

A circuit with variation correction function is capable of obtaining an output characteristic near a desired value by suppressing variation of the output characteristic regardless of manufacturing characteristic variations of a component. An output signal different in phase from a reference signal is obtained by a dummy circuit having a capacitor of a same structure as a correction object capacitor in an operation circuit. The difference in phase between the reference signal and the output signal reflects manufacturing characteristic variation of the correction object capacitor. The difference in phase is detected by a phase comparator circuit and control signals are created by a control signal conversion circuit. Switches in the operation circuit are changed over with the control signal to adjust the capacitance of the correction object capacitor. The correction object capacitor is actuated at a capacitance near design capacitance regardless of manufacturing characteristic variation of the correction object capacitor.

12 Claims, 16 Drawing Sheets

BLOCK DIAGRAM ILLUSTRATING STRUCTURE OF CIRCUIT WITH VARIATION CORRECTION FUNCTION DIRECTED TO EMBODIMENT

CIRCUIT DIAGRAM OF VCO CIRCUIT WHICH IS ACTUAL OPERATION CIRCUIT IN CIRCUIT WITH VARIATION CORRECTION FUNCTION OF FIG.2

BLOCK DIAGRAM EXPLAINING PRINCIPLE OF VARIATION CORRECTION OF PRESENT INVENTION

BLOCK DIAGRAM ILLUSTRATING STRUCTURE OF CIRCUIT WITH VARIATION CORRECTION FUNCTION DIRECTED TO EMBODIMENT

CIRCUIT DIAGRAM OF VCO CIRCUIT WHICH IS ACTUAL OPERATION CIRCUIT IN CIRCUIT WITH VARIATION CORRECTION FUNCTION OF FIG.2

CIRCUIT DIAGRAM ILLUSTRATING STRUCTURE OF CAPACITOR SECTION CORRESPONDING TO GROUP OF TO-BE-CORRECTED ELEMENT IN VCO CIRCUIT OF FIG.3

CIRCUIT DIAGRAM ILLUSTRATING STRUCTURE OF DUMMY CIRCUIT IN CIRCUIT WITH VARIATION CORRECTION FUNCTION OF FIG.2

GRAPH ILLUSTRATING WAVEFORM OF REFERENCE SIGNAL fref AND OUTPUT SIGNAL fref' OF THE DUMMY CIRCUIT CIRCUIT DIAGRAM ILLUSTRATING STRUCTURE OF PHASE COMPARATOR CIRCUIT IN CIRCUIT WITH VARIATION CORRECTION FUNCTION OF FIG.2

GRAPH ILLUSTRATING WAVEFORM OF OUTPUT fpd OF ANEXCLUSIVE OR CIRCUIT OF FIG.7

GRAPH ILLUSTRATING WAVEFORM OF OUTPUT Vpd OF A PHASE COMPARATOR CIRCUIT OF FIG.7 PER EACH MANUFACTURING CHARACTERISTIC VARIATION

CIRCUIT DIAGRAM ILLUSTRATING STRUCTURE OF CONTROL SIGNAL CONVERSION CIRCUIT IN CIRCUIT WITH VARIATION CORRECTION FUNCTION OF FIG.2

CIRCUIT DIAGRAM ILLUSTRATING ANOTHER STRUCTURAL EXAMPLE OF DUMMY CIRCUIT

CIRCUIT DIAGRAM ILLUSTRATING STILL ANOTHER STRUCTURAL EXAMPLE OF DUMMY CIRCUIT

BLOCK DIAGRAM ILLUSTRATING ANOTHER STRUCTURAL EXAMPLE OF CIRCUIT WITH VARIATION CORRECTION FUNCTION DIRECTED TO EMBODIMENT

CIRCUIT DIAGRAM ILLUSTRATING ANOTHER STRUCTURAL EXAMPLE OF TO-BE-CORRECTED ELEMENT

CIRCUIT DIAGRAM OF CONVENTIONAL VCO CIRCUIT

GRAPH ILLUSTRATING OSCILLATION CHARACTERISTIC OF VCO CIRCUIT OF FIG.16

CIRCUIT WITH VARIATION CORRECTION FUNCTION

CROSS-REFERENCE TO RELATED APPLICATIONS

This application is based upon and claims the benefit of priority from each of the prior Japanese Patent Application No. 2002-98892 filed on Apr. 1, 2002, the entire contents of which are incorporated herein by reference.

BACKGROUND OF THE INVENTION

1. Field of the Invention

The present invention relates to an integrated circuit (hereinafter referred to as "IC") and more particularly to a circuit with variation correction function, which suppresses variation of output characteristic regardless of variation of characteristic of components due to manufacturing reason so as to obtain an output near a desired characteristic value. For example, preferably, the present invention is applied to such mobile communication device as a portable phone.

2. Description of Related Art

Recently, reduction of the quantity of required components has been demanded in many electronic device fields, which is represented by such a mobile communication device as a portable phone. For example, in case of the aforementioned mobile communication device, if its oscillation circuit is incorporated in an IC, this contributes to the reduction of the quantity of its components. FIG. 16 shows a voltage control oscillation circuit (hereinafter referred to as "VCO circuit") as an example of such an oscillation circuit. The VCO circuit of FIG. 16 contains a resonant circuit comprising an inductor section 101 and a capacitor section 102. Its oscillation frequency f is given by a following equation with inductance L of the inductor section 101 and capacitance C of the capacitor 102.

[Expression 1]

$$f = \frac{1}{2\pi\sqrt{LC}}$$

The capacity of a variable capacitor in the capacitor section 102 can be changed by control voltage VT. Thus, the oscillation frequency f can be adjusted according to the control voltage VT. A phase lock loop (hereinafter referred to as "PLL") is constituted of such a VCO circuit. Upon use, the oscillation frequency f of the VCO circuit is made to coincide with a setting frequency of PLL.

However, if the aforementioned VCO circuit is incorporated in an IC, following problems occur. That is, characteristic values of incorporated elements vary unavoidably on manufacturing process of the IC. Consequently, the oscillation characteristic of the VCO circuit varies. This will be explained with reference to a graph of FIG. 17. This graph indicates an oscillation frequency f while the control voltage VT is raised from 0.5 V to 2.5 V. This graph further indicates five results that the capacitance C of the capacitor section 102 is finished to −20%, −10%, ±0%, +10%, +20%.

Here, it is assumed that the setting frequency of the PLL is set to 620 MHz. Then, a following matter becomes evident from the graph of FIG. 17. If this circuit is finished as its specification indicates or to ±0%, the control voltage VT for acquiring an output of the setting frequency is 1.6 V. Contrary to this, if the circuit is finished to −20%, the control voltage VT is 1.0 V. On the other hand, if it is finished to +20%, the control voltage VT in this case is 2.2 V, which is different from the preceding case by 1.2 V. The variation of the oscillation characteristic appears as a variation of the control voltage VT when the PLL is locked.

If the capacitance C of the capacitor section 102 is larger or smaller, the oscillation frequency band of the VCO circuit may be deflected completely from the lock range of the PLL. In this case, the PLL locking fails, so that the system cannot be used as desired. Further, even if the oscillation frequency band exists within the lock range, if the control voltage VT is extremely higher or lower than its normal value, the loop characteristic of the PLL is different from its ordinary characteristic. Thus, the phase noise characteristic may deteriorate or lock-up time until the oscillation frequency is locked to the setting frequency may take longer. In the meantime, a similar problem, which may be generated by manufacturing characteristic variation, exists not only in the capacitance of the capacitor device but also in other kinds of devices.

SUMMARY OF THE INVENTION

The present invention has been made to solve above-described problems. It is an object of the present invention to provide a circuit with variation correction function capable of suppressing variation of output characteristic regardless of manufacturing characteristic variation of composing element and obtaining an output that has characteristic close to a desired value.

To achieve the object, according to one aspect of the present invention, there is provided a circuit with variation correction function that has an actual operation circuit and correction circuit mounted on same chip. The corrector circuit is a circuit structured separately from the actual circuit and operates to correct manufacturing characteristic variation of the actual operation circuit. The actual operation circuit includes a to-be-corrected element that is subject to correction. That is, in the inventive circuit with variation correction function, the actual operation circuit operates while the corrector circuit corrects variation of the to-be-corrected element due to manufacturing reason. Therefore, the actual operation circuit operates almost desirably regardless of variation of the to-be-corrected element due to manufacturing reason. The inventive circuit with variation correction function thus can suppress variation of output characteristic regardless of manufacturing characteristic variation of composing element and obtain an output that has characteristic close to a desired value.

In the inventive circuit with variation correction function, the corrector circuit may include a dummy circuit and a converter circuit. The dummy circuit is constituted by element structured same as the to-be-corrected element and receives an input of a reference signal to output a signal to which some changes are added. It should be noted "element structured same" (as the to-be-corrected element) means element composing element of which is common to semiconductor substrate, conductive layer, interlayer insulation layer and the like. For example, in case the to-be-corrected element is a capacitor, common conductive layer is used as electrode plate and insulation layer used as inter-electrode layer is equivalent to "element structured same". However, even though there is capacity difference due to difference of electrode plate area, such an element still corresponds to "element structured same". Since such an element is a composing element structured same as the to-be-corrected element mounted on a same chip, the element has same tendency of manufacturing characteristic variation. Manufacturing characteristic variation mainly derives from interlayer alignment accuracy and this accuracy is constant with respect to identical composing elements on a same chip. Accordingly, difference between an output signal of a dummy circuit and a reference signal is reflective of manufacturing characteristic variation of the to-be-corrected element. A conversion circuit outputs a control signal based on the output signal of the dummy circuit. Since the dummy circuit includes an element structured same as the to-be-corrected element, there can be obtained a control signal that is reflective of manufacturing characteristic variation of the to-be-corrected element.

In the inventive circuit with variation correction function, the actual operation circuit may include a supplemental element and a switch. Type of the supplement element is the same as the to-be-corrected element. The switch is to change connection condition of the to-be-corrected element and the supplement element in accordance with a control signal outputted from the corrector circuit. That is, by opening/closing the switch, a characteristic value of entirety of the to-be-corrected element and the supplemental element can be changed. Furthermore, by opening/closing the switch, the supplemental element may be used instead of the to-be-corrected element. The switch may be operated in accordance with a control signal outputted from the correction circuit. Thereby, a characteristic value of the to-be-corrected element can be changed depending on a detection result through the correction circuit. It should be noted that "similar type of elements" herein means elements that have similar function. More specifically, in case the to-be-corrected element is a capacitor, the supplemental element is also a capacitor, and in case the to-be-corrected element is an inductor, so is the supplement element. However, "similar type of elements" is not limited to the afore-mentioned "element structured same".

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Hereinafter, the embodiments of the present invention will be described in detail with reference to the accompanying drawings.

Figure 1:
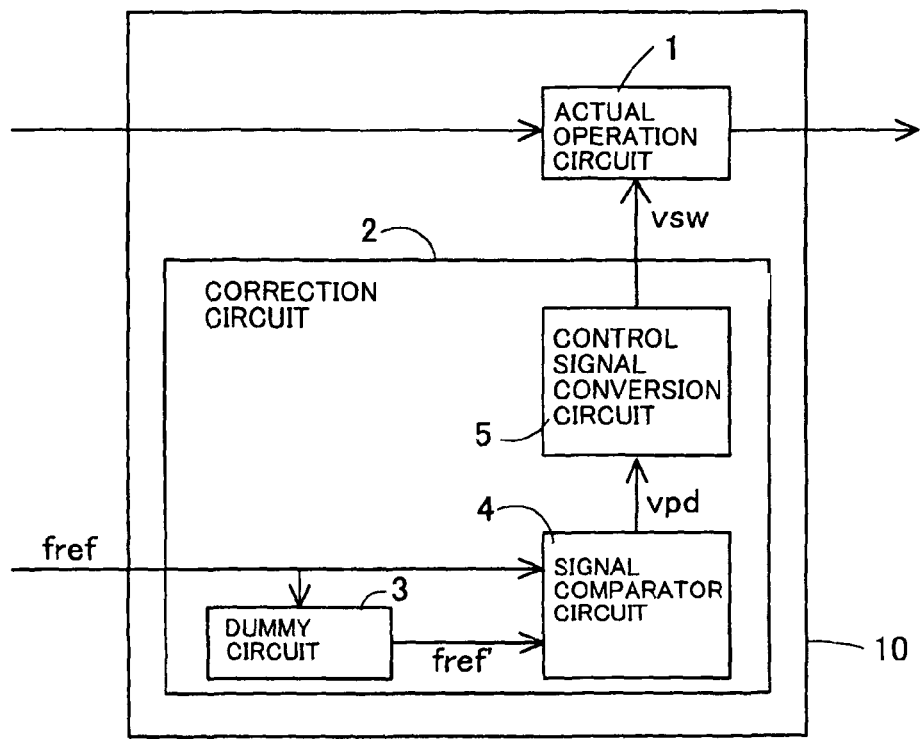
FIG. 1 is a block diagram explaining principle of a variation correction of the present invention.

First, the principle of variation correction of the present invention will be described with reference to a block diagram of FIG. 1. The circuit with variation correction function shown in FIG. 1 comprises an actual operation circuit 1 and a correction circuit 2. These are disposed in one chip. The actual operation circuit 1 is a functional circuit which receives an input and outputs some signal similar to the VCO circuit shown in FIG. 16, which inputs a control voltage VT and outputs an oscillation signal of frequency f. The correction circuit 2 is a circuit to output a control signal to correct manufacturing characteristic variation of an element in the actual operation circuit 1, and is comprised of a dummy circuit 3, a signal comparator circuit 4 and a control signal conversion circuit 5.

The dummy circuit 3 detects how much the characteristic of a correction object element in the actual operation circuit 1 is deflected from the specification because of manufacturing characteristic variation. For the reason, the dummy circuit 3 is constituted of an element having the same structure (hereinafter referred to as a "dummy element") as the correction object element (capacitor here). The reason is that an element having the same structure in one chip has the same tendency about the manufacturing characteristic variation. A reference signal fref is inputted to this dummy circuit 3. Then, the dummy circuit 3 outputs a signal fref' which is produced by applying some modification on the reference signal fref (phase deflection here). A difference between the signal fref' and the reference signal fref (phase difference here) by a dummy element reflects the manufacturing characteristic variation of the dummy element, that is, manufacturing characteristic variation of the correction object element.

The signal comparator circuit 4 receives the reference signal fret and the signal fref' and then outputs a signal vpd indicating the difference between these signals (difference in phase here). The control signal conversion circuit 5 converts the signal vpd to the control signal vsw. By supplying this control signal vsw to the actual operation circuit 1, the manufacturing characteristic variation of the correction object element is corrected. The correction object element in the actual operation circuit 1 has to be so constructed as to be changeable in its characteristic (capacitance here) when it receives the control signal vsw.

Figure 2:
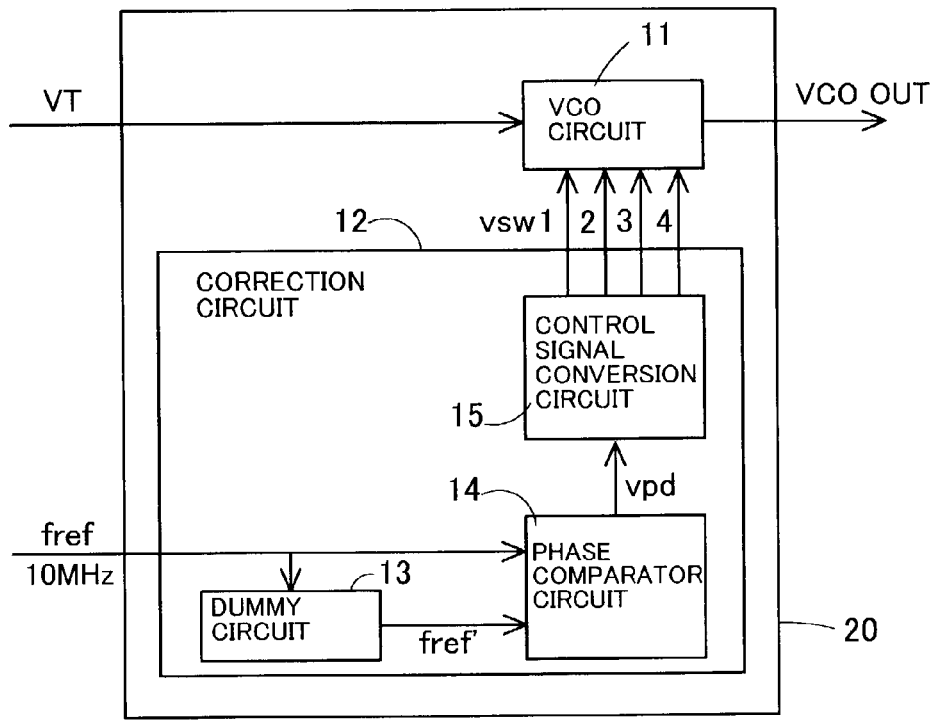
FIG. 2 is a block diagram illustrating structure of a circuit with variation correction function, directed to an embodiment.

Next, the circuit with variation correction function of the embodiment of the present invention will be described. The circuit with variation correction function of this embodiment is so constructed as shown in a block diagram of FIG. 2. A VCO circuit 11 and a correction circuit 12 in FIG. 2 correspond to the actual operation circuit 1 and the correction circuit 2 shown in FIG. 1, respectively. These components are disposed in one chip. Further, a dummy circuit 13, a phase comparator circuit 14 and a control signal conversion circuit 15 in the correction circuit 12 correspond to the dummy circuit 3, the signal comparator circuit 4 and the control signal conversion circuit 5 of FIG. 1, respectively.

Figure 3:
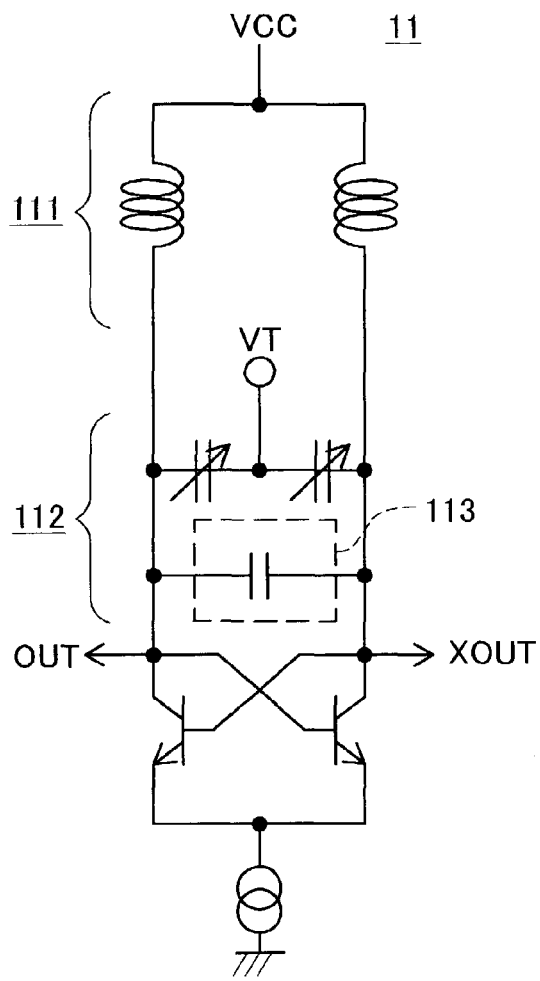
FIG. 3 is a circuit diagram of a VCO circuit which is an actual operation circuit in the circuit with variation correction function of FIG. 2.

FIG. 3 shows an equivalent circuit of the VCO circuit 11. The VCO circuit 11 of FIG. 3 includes a resonance circuit comprising an inductor section 111 and a capacitor section 112. Consequently, when power source voltage VCC and control voltage VT are supplied, the VCO circuit 11 outputs an oscillation signal VCOOUT. Of course, the oscillation frequency f can be adjusted with the control voltage VT.

Figure 4:
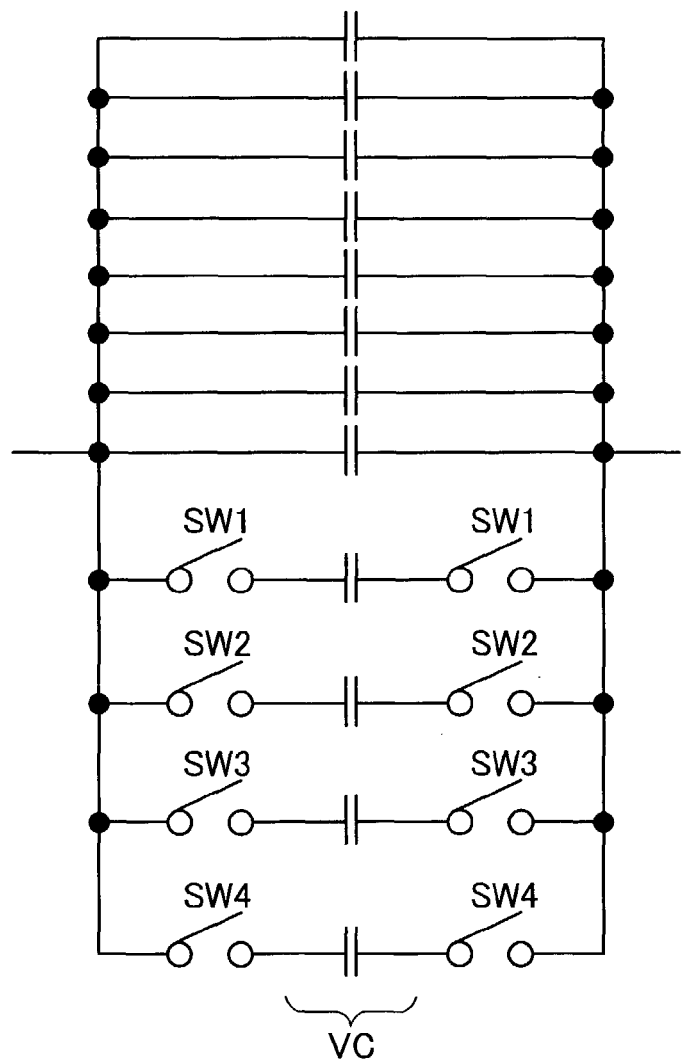
FIG. 4 is a circuit diagram illustrating structure of capacitor section corresponding to a group of to-be-corrected elements in the VCO circuit of FIG. 3.
Figure 16:
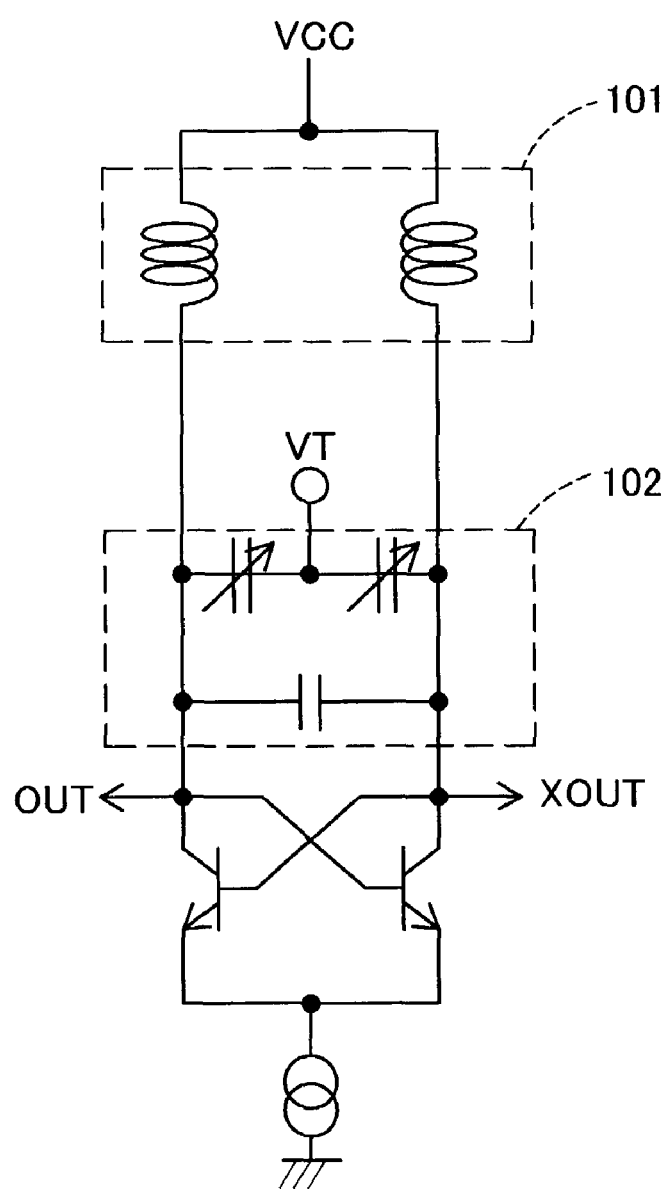
FIG. 16 is a circuit diagram of a conventional VCO circuit.

A difference between the VCO circuit 11 and the VCO circuit of FIG. 16 exists in that a fixed capacitor section 113 in a capacitor section 112 undergoes correction of manufacturing characteristic variation. That is, the equivalent circuit of the fixed capacitor section 113, as shown in FIG. 4, is so constructed that 12 unit capacitors VC (hereinafter, "VC" means the capacitance of each unit capacitor) are connected in parallel. Of the 12 unit capacitors, eight ones shown in the same figure are connected directly not through any switch. The remaining four capacitors are reserved elements, which are connectable through switches SW1-SW4 of the same quantity. Those unit capacitors VC are the same ones in type. Under the standard condition, the switches SW1, SW2 are closed while the switches SW3, SW4 are open. For the reason, total capacitance of the fixed capacitor section 113 is VC×10. Then, the total capacitance of the fixed capacitor section 113 can be switched over to five types, −20%, −10%, ±0%, +10%, +20% with respect to the standard condition. In the meantime, the switches SW1-SW4 are actually constructed as a transmission gate. Alternatively, they may be constructed in PMOS. Although in FIG. 4, the switches SW1-SW4 are provided on both sides to each corresponding unit capacitor VC, they may be disposed on any one side thereof. However, it is favorable to dispose them on both sides as shown in FIG. 4 in order to avoid an influence of parasitic capacitance of the circuit effectively.

Figure 5:
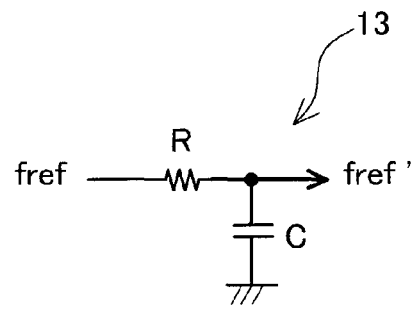
FIG. 5 is a circuit diagram illustrating structure of a dummy circuit in the circuit with variation correction function of FIG. 2.
Figure 6:
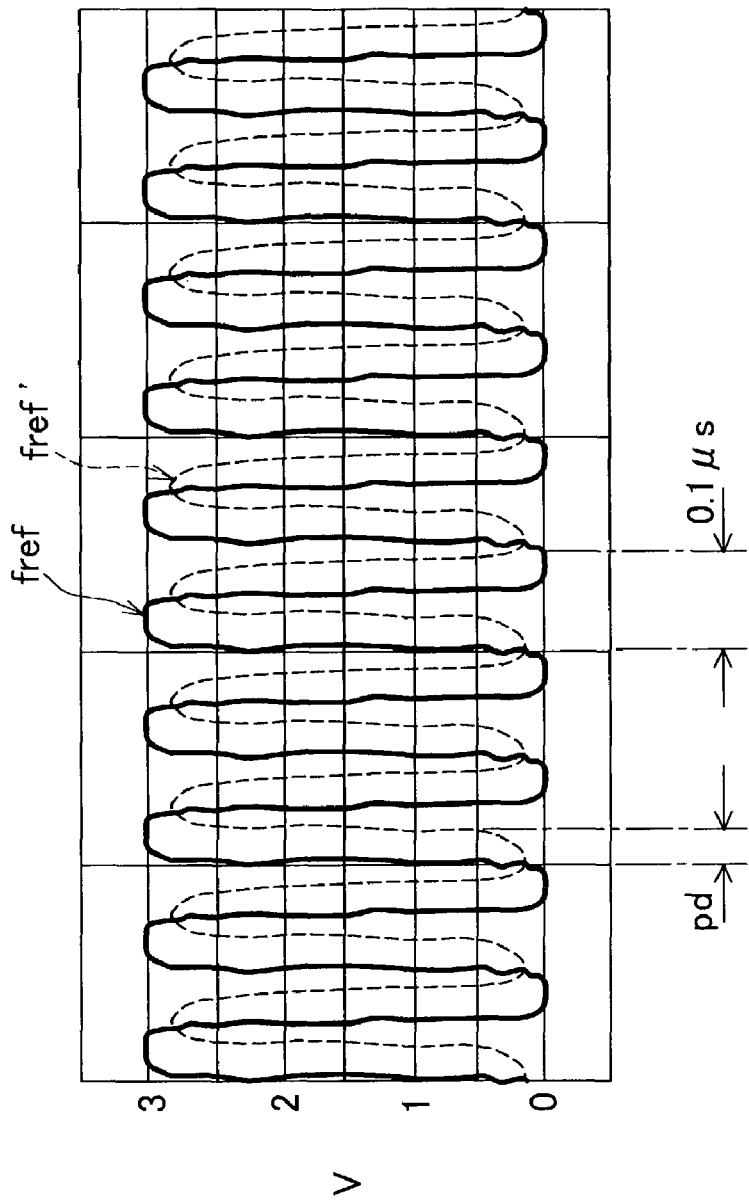
FIG. 6 is a graph illustrating waveform of a reference signal fref and an output signal fref' of the dummy circuit.

Subsequently, the dummy circuit 13 in the correction circuit 12 will be described. As shown in FIG. 5, the dummy circuit 13 is a RC-structured low pass filter, referred as LPF herein after, (see FIG. 6), which outputs the output signal fref' having a difference in phase pd with respect to the input signal fref. The difference in phase pd between the input signal fref and the output signal fref' reflects manufacturing characteristic variation of the capacitor C in the dummy circuit 13. FIG. 6 shows a case where the capacitance of the capacitor C is as specified in the specification. If the capacitance of the capacitor C is larger than the specification specifies, the difference in phase pd is larger than the example shown in FIG. 6. If the capacitance of the capacitor C is smaller the specification specifies, the difference in phase pd is smaller than the example shown in FIG. 6.

As the input signal fref to the dummy circuit 13, a signal used as the reference signal of the PLL (hereinafter referred to as "reference signal fref") is employed. The reference signal fret under this embodiment is a 10-MHz signal. This signal is very convenient because it always exists on a chip if the VCO circuit 11 is adopted as a component of the PLL. Further, this signal is also convenient in that it has no relation with the oscillation frequency f of the VCO circuit 11. That is, the reason is that the difference in phase pd can be detected appropriately regardless of the operating condition of the VCO circuit 11. On the other hand, if an operation signal (output signal, control signal or the like) of the VCO circuit 11 is used as the reference signal fref, unfavorably, the output signal of the dummy circuit 13 is affected by the operation condition of the VCO circuit 11. The capacitor C in the dummy circuit 13 of FIG. 5 has the same element structure as each unit capacitor VC in FIG. 4. That is, the capacitor C and each unit capacitor VC use a common conductive layer as their electrode plates and an insulation layer used as their between-electrodes layers is also common. Therefore, there is an equal tendency in the manufacturing characteristic variation. Thus, the difference in phase between the reference signal fref and the output signal fref' correspond to the manufacturing characteristic variation of the fixed capacitor section 113 of FIG. 4. However, the capacitance of the capacitor C does not have to be equal to VC or VC×10. In conclusion, the capacitance only has to be just large enough for detecting a deflection of the difference in phase pd because of the manufacturing characteristic variation.

Figure 7:
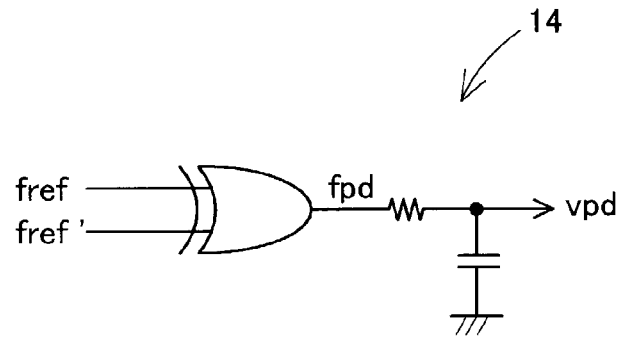
FIG. 7 is a circuit diagram illustrating structure of a phase comparator circuit in the circuit with variation correction function of FIG. 2.
Figure 8:
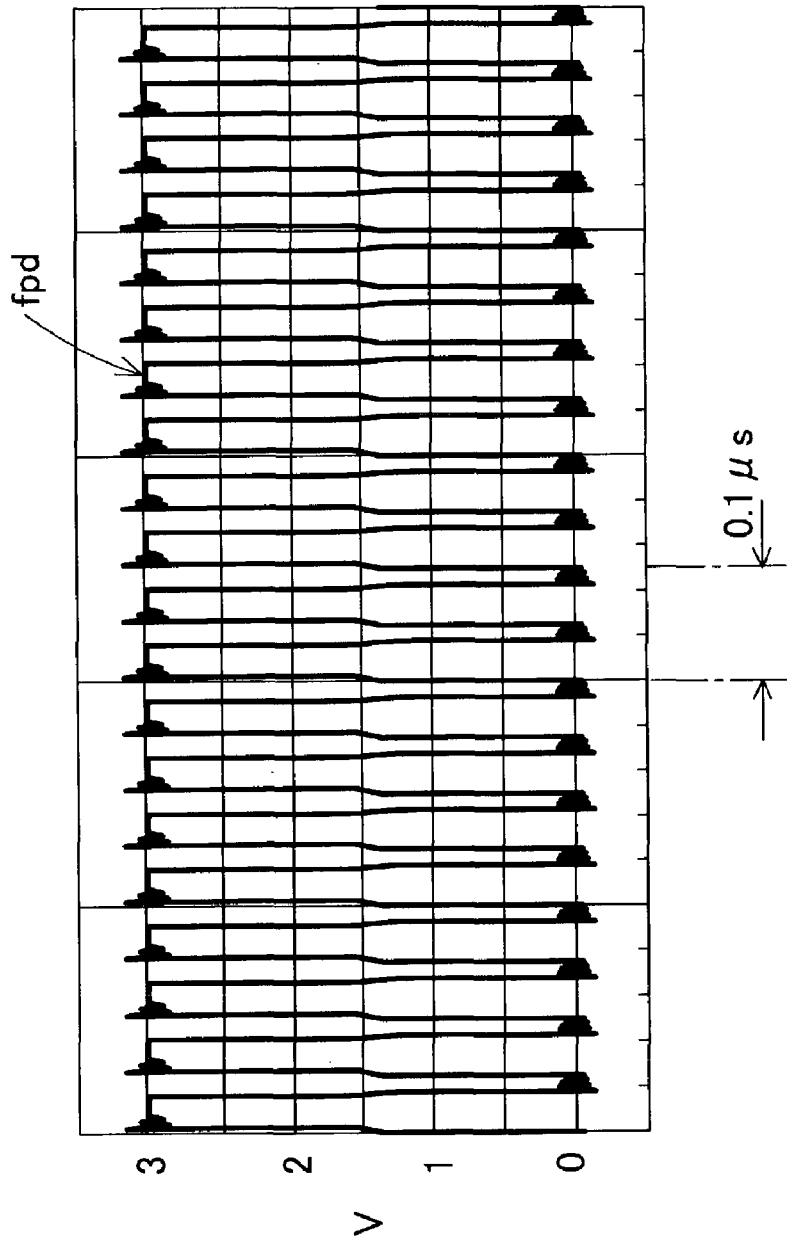
FIG. 8 is a graph illustrating waveform of an output fpd of an exclusive OR circuit of FIG. 7.

Next, the phase comparator circuit 14 in the correction circuit 12 will be described. As shown in FIG. 7, the phase comparator circuit 14 is comprised of an exclusive OR circuit and an LPF. The LPF used here is for smoothing of pulse. The reference signal fref and the output signal fref' of the dummy circuit 13 are inputted to the exclusive OR circuit of FIG. 7. Thus, as shown in FIG. 8, the output signal fpd of the exclusive OR circuit is a pulse signal which is turned ON only in an interval corresponding to the difference in phase pd between the reference signal fref and the output signal fref'. This output signal fpd has a frequency double the frequency of the reference signal fref, whose pulse width is proportional to the magnitude of the difference in phase pd between the reference signal fref and the output signal fref'. FIG. 8 indicates an example in which the capacitance of the capacitor C is as the specification specifies (similar to FIG. 6). If the capacitance of the capacitor C is larger than the specification specifies, the pulse width is larger than the example of FIG. 8. If the capacitance of the capacitor C is smaller than the specification specifies, the pulse width is smaller than the example of FIG. 8. In the meantime, although the reference signal fref and the output signal fref' are not always of rectangular waveform, the output signal fpd can be outputted sufficiently if the threshold of the exclusive OR circuit is set up appropriately. It is permissible to provide with an appropriate buffer MOS, which brings the waveform near the rectangular waveform before the signals are inputted into the exclusive OR circuit.

Figure 9:
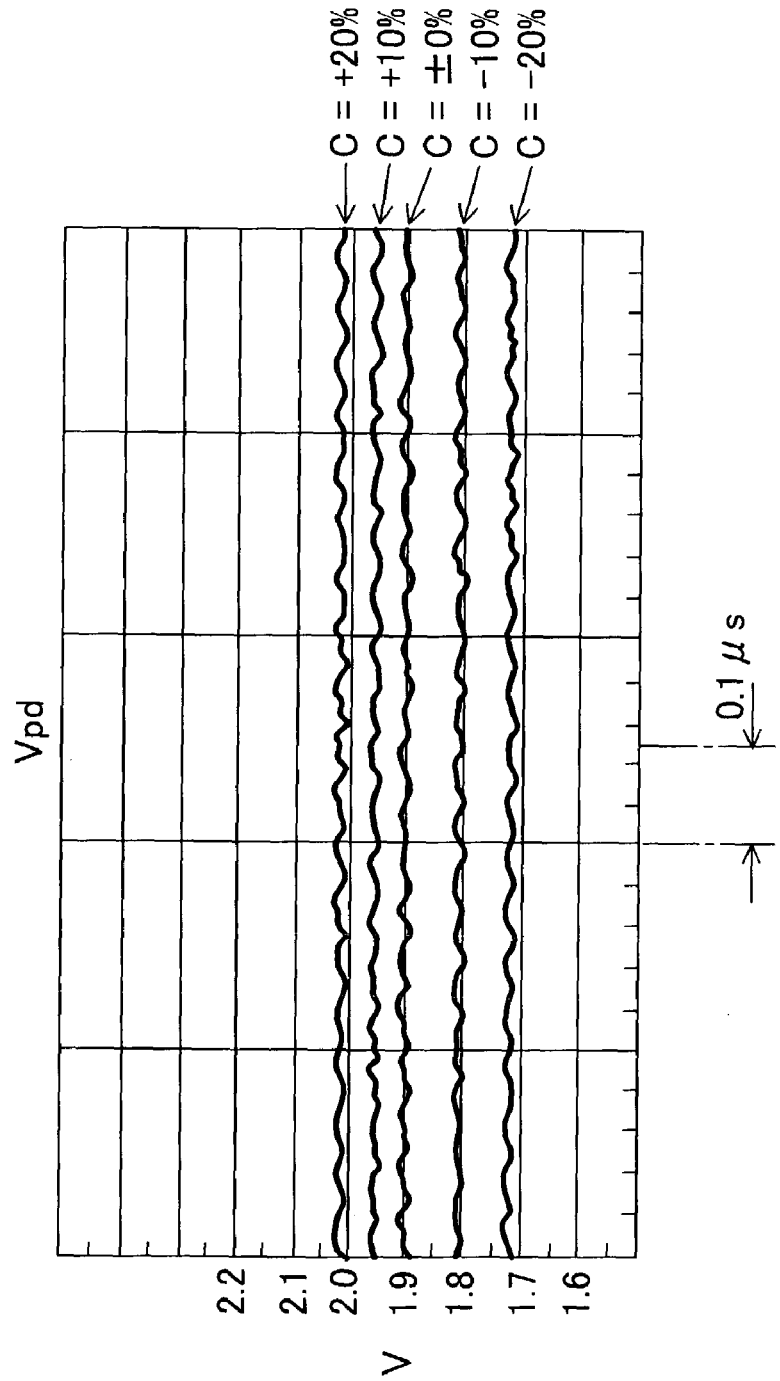
FIG. 9 is a graph illustrating waveform of an output vpd of a phase comparator circuit of FIG. 7 per each manufacturing characteristic variation.

This output signal fpd is passed through the LPF and smoothed. Then, an output signal vpd, which is a DC signal corresponding to a pulse width, is obtained. Of course, the output signal vpd reflects the manufacturing characteristic variation of the capacitor C in the dummy circuit 13. That is, as shown in FIG. 9, the larger the capacitance of the capacitor C, the larger the output signal vpd is. This corresponds to the manufacturing characteristic variation of the fixed capacitor section 113 of FIG. 4. In this way, the output signal vpd is obtained based on the difference in phase pd. Although the phase is preferred to be detected independently, the output signal vpd can be acquired appropriately by using the difference in phase pd.

Figure 10:
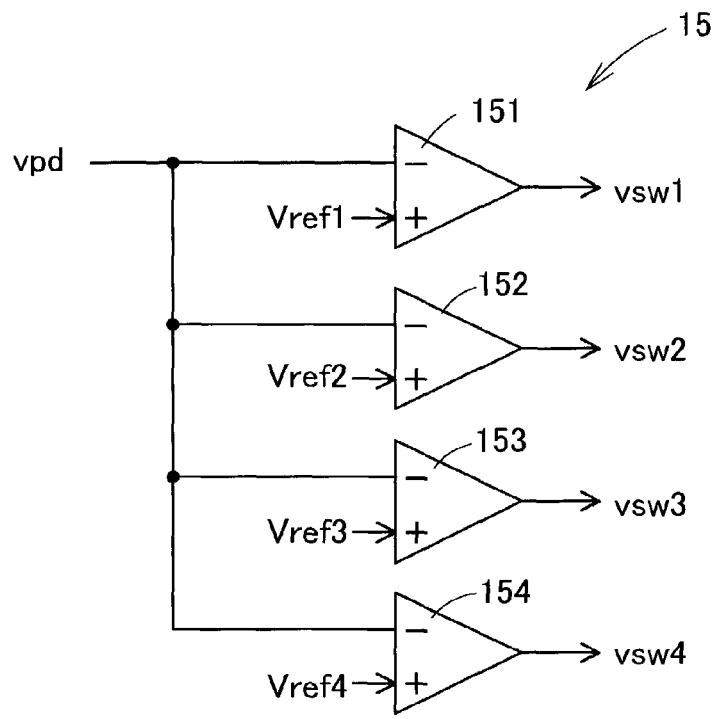
FIG. 10 is a circuit diagram illustrating structure of a control signal conversion circuit in the circuit with variation correction function of FIG. 2.

Next, the control signal conversion circuit 15 in the correction circuit 12 will be described. The control signal conversion circuit 15 is comprised of four comparators 151-154 as shown in FIG. 10. The number of the comparators here corresponds to the number of the unit capacitors VC provided with a switch in the fixed capacitor section 113 of FIG. 4. The output signal vpd of the phase comparator circuit 14 is inputted to a minus input terminal of each of the comparators 151-154. The reference voltages Vref1-Vref4 are inputted to a plus input terminal of each of the comparators 151-154. Although the reference voltages Vref1-Vref4 can be set up in any way by a divided voltage from the power source voltage VCC, they are set up as follows.

The reference voltage Vref1 is an output value of the phase comparator circuit 14 in case of the capacitance of the capacitor is +15% the specification specifies. For the reason, if the output value of the phase comparator circuit 14 is higher than a value in case of the capacitance of the capacitor is +15% the specification specifies, the output signal vsw1 of the comparator 151 is turned OFF. If the output value of the phase comparator circuit 14 is lower than the value, the output signal vsw1 of the comparator 151 is turned ON.

The reference voltage Vref2 is an output value of the phase comparator circuit 14 in case of the capacitance of the capacitor is +5% the specification specifies. Thus, if the output value of the phase comparator circuit 14 is higher than a value in case of the capacitance of the capacitor is +5% the specification specifies, the output signal vsw1 of the comparator 151 is turned OFF. If the output value of the phase comparator circuit 14 is lower than the value, the output signal vsw1 of the comparator 151 is turned ON.

The reference voltage Vref3 is an output value of the phase comparator circuit 14 in case of the capacitance of the capacitor is −5% the specification specifies. Thus, if the output value of the phase comparator circuit 14 is higher than a value in case of the capacitance of the capacitor is −5% the specification specifies, the output signal vsw1 of the comparator 151 is turned OFF. If the output value of the phase comparator circuit 14 is lower than the value, the output signal vsw1 of the comparator 151 is turned ON.

The reference voltage Vref4 is an output value of the phase comparator circuit 14 in case of the capacitance of the capacitor is −15% the specification specifies. Thus, if the output value of the phase comparator circuit 14 is higher than a value in case of the capacitance of the capacitor is −15% the specification specifies, the output signal vsw1 of the comparator 151 is turned OFF. If the output value of the phase comparator circuit 14 is lower than the value, the output signal vsw1 of the comparator 151 is turned ON.

The output signals vsw1-vsw4 of the respective comparators 151-154 are inputted to the switches SW1-SW4 of the fixed capacitor section 113 of FIG. 4. The switches SW1-SW4 are closed if the corresponding output signals vsw1-vsw4 are ON and open if OFF.

The circuit with variation correction function of this embodiment having the above described structure is actuated as follows. In the correction circuit 12, first, the output signal fref' with the difference in phase to the reference signal fref is created by the dummy circuit 13, the output signal vpd corresponding to a difference in phase between the reference signal fref and the output signal fref' is outputted by the phase comparator circuit 14. Consequently, the output signals vsw1-vsw4 are created corresponding to this output signal vpd by the control signal conversion circuit 15.

TABLE 1

| CAPACITANCE | vsw1 | vsw2 | vsw3 | vsw4 | SW1 | SW2 | SW3 | SW4 |
|---|---|---|---|---|---|---|---|---|
| +15%~ | 0 | 0 | 0 | 0 | OPEN | OPEN | OPEN | OPEN |
| +5~+15% | 1 | 0 | 0 | 0 | CLOSED | OPEN | OPEN | OPEN |
| −5~+5% | 1 | 1 | 0 | 0 | CLOSED | CLOSED | OPEN | OPEN |
| −15~.5% | 1 | 1 | 1 | 0 | CLOSED | CLOSED | CLOSED | OPEN |
| ~−15% | 1 | 1 | 1 | 1 | CLOSED | CLOSED | CLOSED | CLOSED |

First, assume that the capacitance of the capacitor C in the dummy circuit 13 is in a range of ±5% the specification specifies. In this case, as shown at the third row of Table 1, the output signals vsw1 vsw2 of the control signal conversion circuit 15 are turned ON while the output signals vsw3, vsw4 are turned OFF. Thus, in the fixed capacitor section 113 of FIG. 4, the switches SW1, SW2 are closed while the switches SW3, SW4 are open. This is the standard condition of the fixed capacitor section 113. The fixed capacitor section 113 in this condition is said to be so constructed that 10 unit capacitors VS are connected in parallel.

If the capacitance of the capacitor C in the dummy circuit 13 is in a range of +5 to +15% the specification specifies, the output signal vsw2 is OFF different from the standard condition as shown in the second row of Table 1. Thus, the switch SW2 is open in the fixed capacitor section 113. It can be said that the fixed capacitor section 113 in this condition is constituted of nine unit capacitors VC connected in parallel. If the capacitance of the capacitor C in the dummy circuit 13 is higher than +15%, the output signal vsw1 is OFF as shown on the first row of Table 1. Thus, the switch SW1 in the fixed capacitor section 113 is open. It can be said that the fixed capacitor section 113 in this condition is constituted of eight unit capacitors VC connected in parallel. If the capacitance of the capacitor C in the dummy circuit 13 is in a range of −15 to −5% the specification specifies, the output signal vsw3 is ON different from the standard condition as shown on the fourth row of Table 1. Thus, the switch SW3 in the fixed capacitor section 113 is closed. It can be said that the fixed capacitor section 113 in this condition is constituted of eleven unit capacitors VC connected in parallel. If the capacitance of the capacitor C in the dummy circuit 13 is less than −15% the specification specifies, the output signal vsw4 is ON as shown on the fifth row of Table 1. Thus, the switch SW4 in the fixed capacitor section 113 is closed. It can be said that the fixed capacitor section 113 in this condition is constituted of twelve unit capacitors VC connected in parallel.

For the above reason, even if the capacitance of the capacitor in the VCO circuit 11 of FIG. 3 varies because of the manufacturing characteristic variation, the total capacitance of the fixed capacitor section 113 is corrected by the correction section 12. If the capacitance of the capacitor is −20%, −10%, ±0%, +10%, +20% the specification specifies, the total capacitance of the fixed capacitor section 113 is as follows. The "TVC" mentioned here refers to a design capacitance of the unit capacitor VC.

In case of −20%:

$$\text{total capacitance} = (TVC \times 0.8) \times 12 = TVC \times 9.6$$

In case of −10%:

$$\text{total capacitance} = (TVC \times 0.9) \times 11 = TVC \times 9.9$$

In case of ±10%:

total capacitance=$(TVC\times1.0)\times10=TVC\times10$

In case of +10%:

total capacitance=$(TVC\times1.1)\times9=TVC\times9.9$

In case of +20%:

total capacitance=$(TVC\times1.2)\times8=TVC\times9.6$

For comparison, the total capacitance of the fixed capacitor section 113 in case where no correction is carried out with the correction circuit 12 is shown here.
In case of −20%:

total capacitance=$(TVC\times0.8)\times10=TVC\times8$

In case of −10%:

total capacitance=$(TVC\times0.9)\times10=TVC\times9$

In case of ±10%:

total capacitance=$(TVC\times1.0)\times10=TVC\times10$

In case of +10%:

total capacitance=$(TVC\times1.1)\times10=TVC\times11$

In case of +20%:

total capacitance=$(TVC\times1.2)\times10=TVC\times12$

Figure 11:
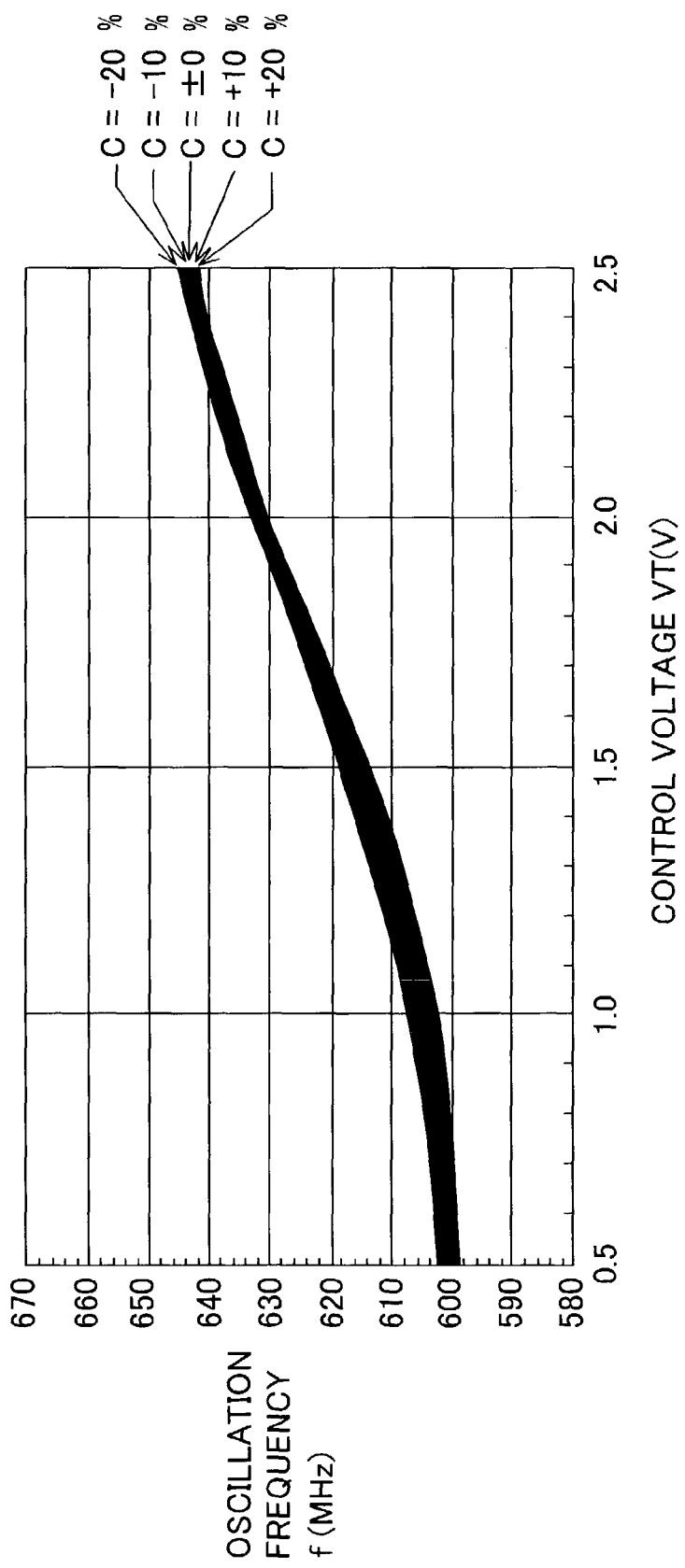
FIG. 11 is a graph illustrating oscillation characteristic of the VCO circuit of FIG. 3.
Figure 17:
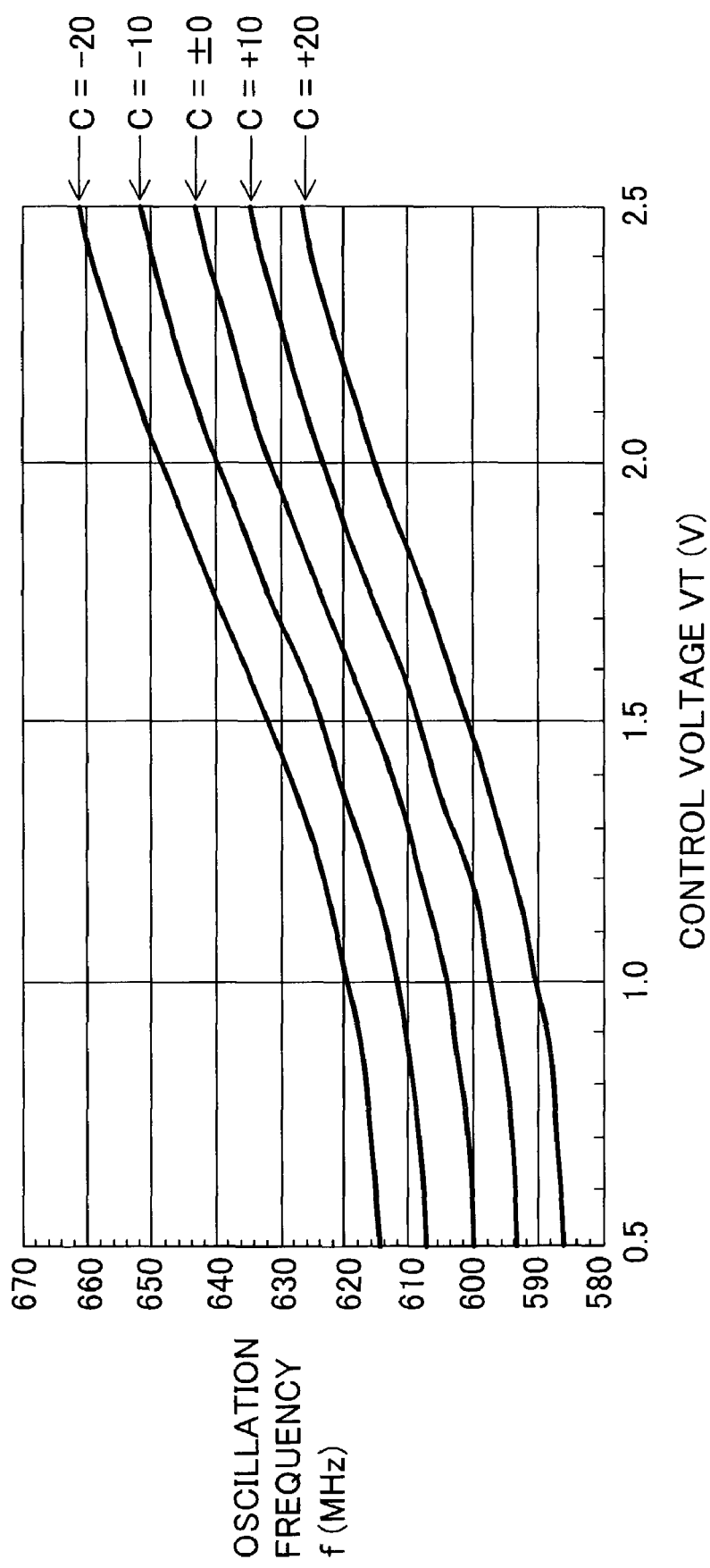
FIG. 17 is a graph illustrating oscillation characteristic of the VCO circuit of FIG. 16.

Comparison of these matters indicates a following fact. That is, if no correction is performed, the manufacturing characteristic variation reflects the total capacitance of the fixed capacitor section 113 just as it is. On the other hand, if correction is performed, even if the capacitance is deflected from the specification by +20% or −20%, the deflection of the total capacitance from its normal value of the fixed capacitor section 113 is only 4%. This fact indicates that this embodiment blocks the deflection of the total capacitance of the fixed capacitor section 113 because of the manufacturing characteristic variation effectively. FIG. 11 shows the oscillation characteristic of the VCO circuit 11 in case where correction is performed. This indicates the oscillation frequency f while the control voltage VT is changed from 0.5 V to 2.5 V. Although this graph looks to contain a single drawn bold curve, five curves are drawn such that they are nearby. Referring to FIG. 11, the range of the control voltage VT for acquiring a setting frequency 620 MHz of the PLL is in a range of about 1.55 to about 1.7 V, which has only a difference of about 0.15 V. Comparing with the example of FIG. 17 based on the conventional technology that this difference is as large as 1.2 V, it is apparent that the manufacturing characteristic variation is suppressed largely by correction according to this embodiment.

In the meantime, if the capacitance of the capacitor is in the vicinity of any of −15%, −5%, +5%, +15% the specification specifies, the total capacitance of the fixed capacitor 113 is as follows.
In case of −16%:

total capacitance=$(TVC\times0.84)\times12=TVC\times10.01$

In case of −14%:

total capacitance=$(TVC\times0.86)\times11=TVC\times9.46$

In case of −6%:

total capacitance=$(TVC\times0.94)\times11=TVC\times10.34$

In case of −4%:

total capacitance=$(TVC\times0.96)\times10=TVC\times9.6$

In case of +4%:

total capacitance=$(TVC\times1.04)\times10=TVC\times10.4$

In case of +6%:

total capacitance=$(TVC\times1.06)\times9=TVC\times9.54$

In case of +14%:

total capacitance=$(TVC\times1.14)\times9=TVC\times10.26$

In case of +16%:

total capacitance=$(TVC\times1.16)\times8=TVC\times9.28$

As indicated above, the deflection from a normal value may be slightly larger if comparing with a case where the capacitance of the capacitor is any one of −20%, −10%, ±0%, +10%, +20% the specification specifies. However, if comparing with a case where no correction is performed, the deflection from the normal value is smaller. The reason is that the manufacturing characteristic variation does not reflect the total capacitance of the fixed capacitor section 113 as it is.

Figure 12:
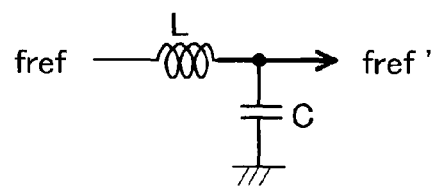
FIG. 12 is a circuit diagram illustrating another structural example of the dummy circuit.

Hereinafter, other embodiment will be described. FIG. 12 shows a modification of the dummy circuit 13. The dummy circuit of FIG. 12 is constituted of not a RC filter but a LC filter. This dummy circuit is used when the inductor section 111 in the VCO circuit 11 of FIG. 3 is handled as a correction object section. The inductor section 111 in this case needs to be so constructed that both its right and left inductors in FIG. 3 are capable of changing the characteristic (inductance in this case) according to an output signal from the control signal conversion circuit 15 like the fixed capacitor section 113 of FIG. 4. More specifically, each capacitor of the circuit of FIG. 4 is exchanged with an inductor. Total variation of inductance and capacitance can be corrected with only the capacitor or only the inductor. The reason is that the oscillation frequency f depends on a product of L and C as shown in equation 1.

Figure 13:
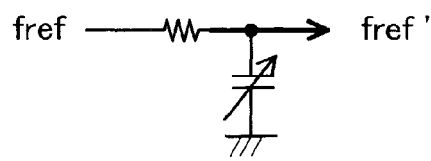
FIG. 13 is a circuit diagram illustrating still another structural example of the dummy circuit.

FIG. 13 shows another example of the dummy circuit 13. The dummy circuit of FIG. 13 contains a variable capacitor instead of a capacitor C in the dummy circuit 5, of course, this example is used when the variable capacitor in the VCO circuit 11 is handled as a correction object section.

Figure 14:
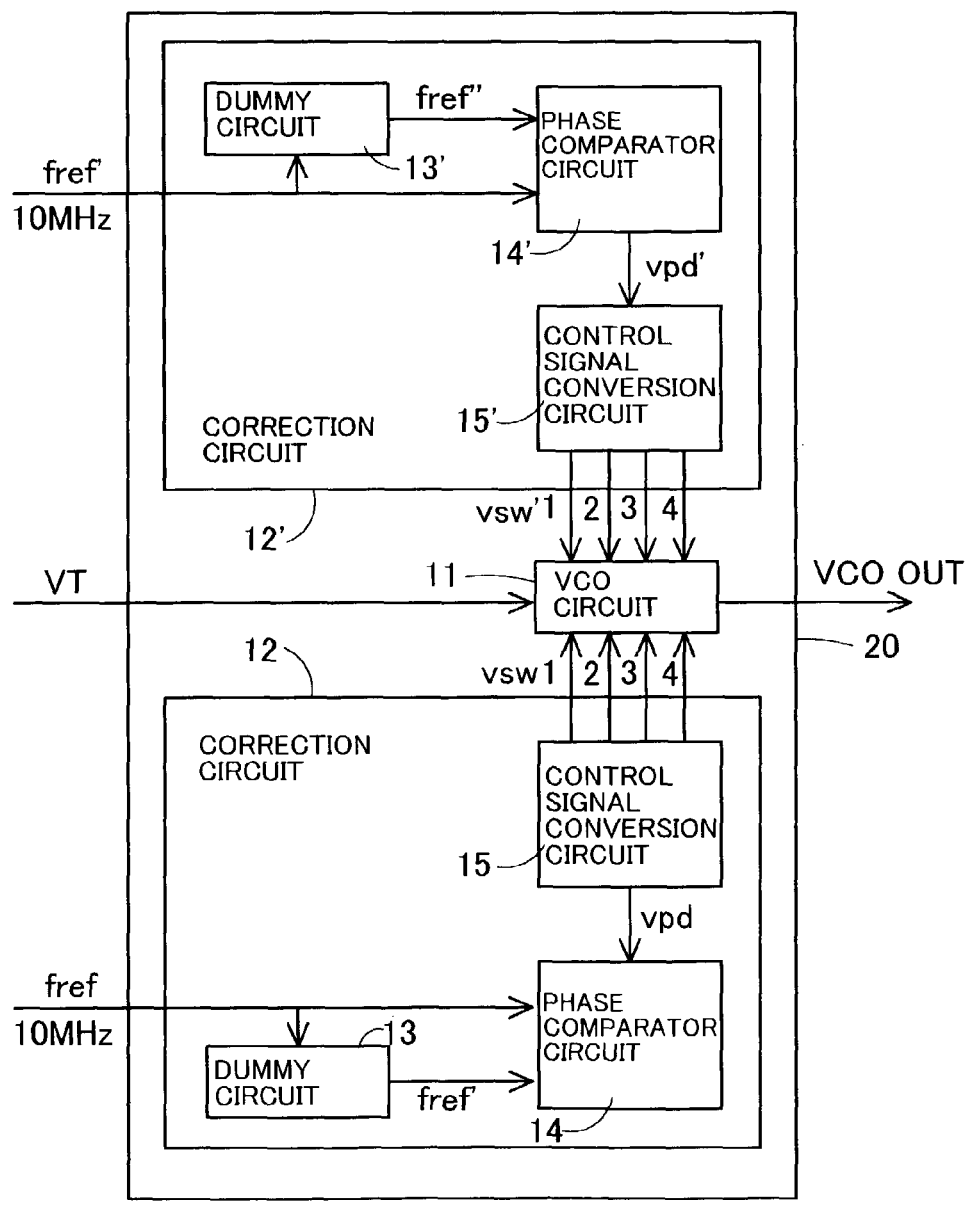
FIG. 14 is a block diagram illustrating another structural example of the circuit with variation correction function, directed to the embodiment.

FIG. 14 shows a circuit with variation correction function containing two correction circuits 12, 12'. Because this circuit with variation correction function contains the two correction circuits, one corrector circuit corrects the fixed capacitor section 113 of the VCO circuit 11 while another corrector circuit corrects the variable capacitor in the VCO circuit 11. For this purpose, the dummy circuit 13 of the corrector circuit 12 needs to be as shown in FIG. 5 while the dummy circuit 13' of the corrector circuit 12' needs to be as shown in FIG. 13. Of course, the correction object section in the VCO circuit 11 is not restricted to a combination of the fixed capacitor section 113 and the variable capacitor. This may be a combination of the inductor section 111 and the variable capacitor or a combination of the fixed capacitor section 113 and the inductor section 111.

As described in detail above, according to this embodiment, the VCO circuit 11 and the corrector circuit 12 are provided in the same chip. Then, the dummy circuit 13 is provided in the corrector circuit 12 and the dummy circuit 13 is constituted of the capacitor C having the same structure as each unit capacitor VC of the fixed capacitor section 113, which is a correction object section in the VCO circuit 11. This dummy circuit 13 enables to acquire the output signal fref' having the difference in phase pd corresponding to the manufacturing characteristic variation of the fixed capacitor section 113. Particularly, the reference signal fref for acquiring the output signal fref' always exists on a chip and has no relation with the oscillation frequency f of the VCO circuit 11. For the reason, the output signal fref' reflecting the manufacturing characteristic variation appropriately can be obtained regardless of the operation condition of the VCO circuit 11. Then, the control signal conversion circuit 15 for outputting the output signals vsw1-vsw4 based on the difference in phase pd are provided in the corrector circuit 12 while the switches SW1-SW4 for receiving the output signals vsw1-vsw4 are provided in the fixed capacitor section 113. Consequently, the total capacitance of the fixed capacitor section 113 is changed with the output signals vsw1-vsw4. As a result, there is achieved a circuit with variation correction function in which the total capacitance on actual operation of the fixed capacitor section 113 does not change so much regardless of the manufacturing characteristic variation of the capacitor.

In the circuit with variation correction function of this embodiment, correction of the manufacturing characteristic variation is carried out in a chip. Thus, constituting a phase lock loop using this circuit with variation correction function provides a following advantage. Namely, a desired oscillation frequency can be obtained securely without providing with another correction means outside a chip. Thus, this embodiment can be applied preferably to fields of mobile communication devices which require reduction in quantity of components or compactness of the structure strictly.

This embodiment is a mere exemplification and does not restrict the present invention. Therefore, the present invention may be improved or modified in various ways within a scope not departing from the gist of the present invention. For example, an element which is a correction object is not restricted to a capacitor or an inductor. Any element may be used as long as it is formed on a semiconductor chip. Further, an object circuit is not restricted to the VCO circuit but may be other kind of the oscillation circuit, a filter circuit like a GMC filter, a delay circuit, an amplifying circuit or any other circuit as long as it is formed on the semiconductor chip. The input signal to the control signal conversion circuit of the corrector circuit is not restricted to the difference in phase between the reference signal and the output signal of the dummy circuit. For example, it may be an electromagnetic quantity of other kind or a difference thereof. Further, if there exists any capacitor in the dummy circuit, it may be time needed for charging or discharging under a predetermined condition. Further, it is permissible to construct an oscillation circuit in the dummy circuit and use its oscillation frequency.

According to this embodiment, the number of the unit elements to be connected through a switch at a correction object section in the actual operation circuit is "4". Also, the number of the output signals from the control signal conversion circuit is "4". However, these are not restricted to "4". If that number is set larger, steps for variation correction can be made narrower or a correction object range can be set larger.

According to this embodiment, the reference voltages Vref1-Vref4 for use in the respective comparators 151-154 of the control signal conversion circuit 15 are the output values of the phase comparator circuit 14 in case where the capacitance of the capacitor is +15%, +5%, −5%, −15% the specification specifies. However, the reference voltage is not restricted to this example, but may be determined as follows. For example, the reference voltage Vref1 is set to an average value between the output value of the phase comparator circuit 14 when the capacitance of the capacitor is +20% the specification specifies and the output value of the phase comparator circuit 14 when the capacitance of the capacitor is +10% the specification specifies. Likewise, the reference voltage Vref2 is set to an average value between the output value of the phase comparator circuit 14 when the capacitance of the capacitor is +10% the specification specifies and the output value of the phase comparator circuit 14 when the capacitance of the capacitor is ±0%. Likewise, the reference voltage Vref3 is set to an average value between the output value of the phase comparator circuit 14 when the capacitance of the capacitor is ±0% the specification specifies and the output value of the phase comparator circuit 14 when the capacitance of the capacitor is −10%. Likewise, the reference voltage Vref4 is set to an average value between the output value of the phase comparator circuit 14 when the capacitance of the capacitor is −10% the specification specifies and the output value of the phase comparator circuit 14 when the capacitance of the capacitor is −20%. Even if the reference voltages Vref1-Vref4 are determined as described above, substantially the same effect can be exerted.

According to this embodiment, as a specific structure of a correction object section, twelve same unit capacitors are connected in parallel. However, the eight unit capacitors not through a switch may be replaced with a single large-capacitance capacitor. Further, the capacitance of each capacitor may be set up as follows.

| | |
|---|---|
| Total of capacitor not through a switch | VC × 8.3 |
| Capacitor of switch SW1 | VC × 0.8 |
| Capacitor of switch SW2 | VC × 0.9 |
| Capacitor of switch SW3 | VC × 1.1 |
| Capacitor of switch SW4 | VC × 1.4 |

As a result, correction of manufacturing characteristic variation is improved as follows.

In case of +20%

Total capacitance=$(TVC \times 1.2) \times 8.3 = TVC \times 9.96$

In case of +10%

Total capacitance=$(TVC \times 1.1) \times (8.3+0.8)$ $=(TVC \times 1.1) \times 9.1 = TVC \times 10.01$ In case of ±0%

Total capacitance=$(TVC \times 1.0) \times (9.1+0.9)$ $=(TVC \times 1.0) \times 10 = TVC \times 10$ In case of −10%

Total capacitance=$(TVC \times 0.9) \times (10+1.1)$ $=(TVC \times 0.9) \times 11.1 = TVC \times 9.99$ In case of −20%

Figure 15:
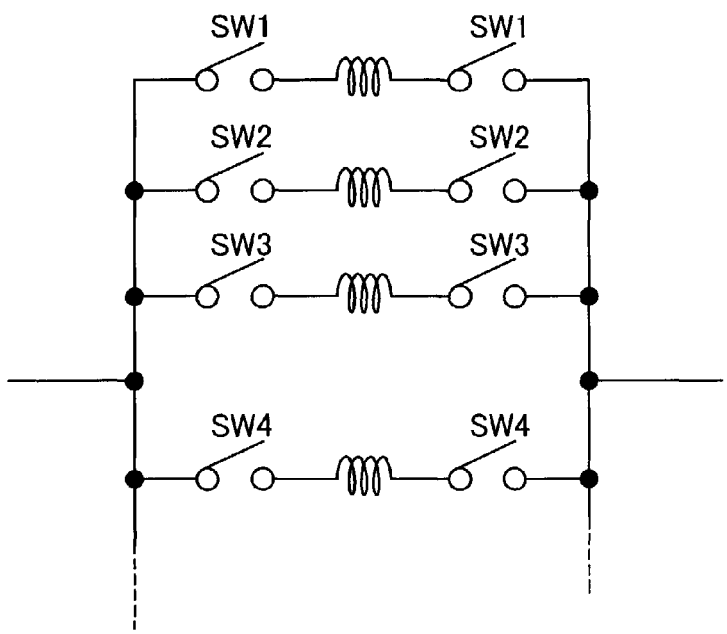
FIG. 15 is a circuit diagram illustrating another structural example of the to-be-corrected element.

Total capacitance=$(TVC \times 0.8) \times (11.1+1.4)$ $=(TVC \times 0.8) \times 12.5 = TVC \times 10.0$ As a specific structure of the correction object section, a method in which elements are employed separately as shown in FIG. 15 can be considered as well as the parallel connection type shown in FIG. 4. FIG. 15 shows a type in which plural inductors whose inductance differs slightly from each other are used selectively with switches for receiving the control signal. The control signal conversion circuit in this case has to be so constructed that only one of respective control signals is turned ON depending on the output of the dummy circuit. Additionally, a correction object section of series connection type is considered.

As evident from the above description, according to the present invention, there is provided a circuit with variation correction function capable of obtaining an output of the characteristic near a desired value by suppressing variation of the output characteristic regardless of the manufacturing characteristic variation of a component. Particularly, a control signal reflecting the manufacturing characteristic variation of a correction object element can be supplied to a correction object element by providing with the dummy circuit with an element having the same structure and in the same chip as the correction object element. Further, a control signal reflecting the manufacturing characteristic variation of the correction object element can be obtained without being affected by the operation condition of the actual operation circuit by using a signal unrelated to the operation signal of the actual operation circuit as a reference signal of the correction circuit. Further, the entire characteristic value of the correction object element and a reserved element can be switched over depending on detection of the manufacturing characteristic variation in a correction object circuit by providing with the reserved element which is the same element as the correction object element and its switch.

What is claimed is:

1. A circuit with variation correction function comprising:
    an actual operation circuit which receives a voltage control signal and outputs an oscillation signal having a frequency corresponding to the voltage control signal, and which includes a to-be-corrected element, wherein the actual operation circuit is a voltage control oscillator, which includes a resonance circuit receiving the voltage control signal; and
    a correction circuit which is structured separately from the actual operation circuit, uses a signal which is not related to the voltage control signal as the reference signal, and outputs a control signal reflecting manufacturing characteristic variations to the actual operation circuit without being affected by an operation condition of the actual operation circuit, wherein the control signal is not fed back to the correction circuit;
    wherein the actual operation circuit and the correction circuit are arranged in one chip, and the manufacturing characteristic variations of the to-be-corrected element in the actual operation circuit are corrected for operation by the control signal outputted from the correction circuit, and
    wherein the correction circuit includes:
    a dummy circuit which is constituted by an element structured same as the to-be-corrected element and receives an input of a reference signal; and
    a conversion circuit which outputs the control signal based on an output signal of the dummy circuit.

2. A circuit with variation correction function according to claim 1, wherein the conversion circuit generates the control signal based on a difference between the reference signal and the output signal of the dummy circuit.

3. A circuit with variation correction function according to claim 2,
    wherein the dummy circuit outputs a signal which has a phase difference with reference to the reference signal; and
    the conversion circuit generates the control signal based on the phase difference between the reference signal and the output signal of the dummy circuit.

4. A circuit with variation correction function according to claim 1,
    wherein the actual operation circuit includes: a supplemental element type of which is similar to the to-be-corrected element; and
    a switch for changing connection condition of the to-be-corrected element and the supplemental element according to the control signal outputted from the correction circuit.

5. A circuit with variation correction, function according to claim 2,
    wherein the actual operation circuit includes: a supplemental element type of which is the same as the to-be-corrected element; and
    a switch for changing connection condition of the to-be-corrected element and the supplemental element according to the control signal outputted from the correction circuit.

6. A circuit with variation correction function according to claim 3,
    wherein the actual operation circuit includes: a supplemental element type of which is same as the to-be-corrected element; and
    a switch for changing connection condition of the to-be-corrected element and the supplemental element according to the control signal outputted from the correction circuit.

7. A circuit with variation correction function according to claim 4,
    wherein the actual operation circuit further includes: a plurality of the supplemental elements and the switches as many as or more than the supplemental elements; and
    each of the switches connects the to-be-corrected element and one of the supplemental elements so that a characteristic of the to-be-corrected element and the supplemental element as a whole should approximate to a design value of characteristic with respect to the to-be-corrected element, according to the control signal outputted from the correction circuit.

8. A circuit with variation correction function according to claim 5,
    wherein the actual operation circuit further includes: a plurality of the supplemental elements and the switches as many as or more than the supplemental elements; and
    each of the switches connects the to-be-corrected element and one of the supplemental elements so that a characteristic of the to-be-corrected element and the supplemental element as a whole should approximate to a design value of characteristic with respect to the to-be-corrected element, according to the control signal outputted from the correction circuit.

9. A circuit with variation correction function according to claim 6,
    wherein the actual operation circuit further includes: a plurality of the supplemental elements and the switches as many as or more than the supplemental elements; and
    each of the switches connects the to-be-corrected element and one of the supplemental elements so that a characteristic of the to-be-corrected element and the supplemental element as a whole should approximate to a design value of characteristic with respect to the to-be-corrected element, according to the control signal outputted from the correction circuit.

10. A circuit with variation correction function according to claim 7,
    wherein the conversion circuit includes comparators as many as the supplemental elements, which compare the output signal of the dummy circuit with reference values and generate control signals according to comparison results;
    each of the comparators has its own reference value; and
    each of the switches changes connection conditions of the corresponding supplemental element and the to-be-corrected element, based on the control signal from the corresponding comparator.

11. A circuit with variation correction function according to claim 8,
wherein the conversion circuit includes comparators as many as the supplemental elements, which compare the output signal of the dummy circuit with reference values and generate control signals according to comparison results;

each of the comparators has its own reference value; and each of the switches changes connection conditions of the corresponding supplemental element and the to-be-corrected element, based on the control signal from the corresponding comparator.

12. A circuit with variation correction function according to claim 9, wherein the conversion circuit includes comparators as many as the supplemental elements, which compare the output signal of the dummy circuit with reference values and generate control signals according to comparison results;

each of the comparators has its own reference value; and each of the switches changes connection conditions of the corresponding supplemental element and the to-be-corrected element, based on the control signal from the corresponding comparator.

* * * * *